(12) United States Patent  (10) Patent No.: US 7,609,800 B1
Lim et al.  (45) Date of Patent: Oct. 27, 2009

(54) COUNTER OF SEMICONDUCTOR DEVICE

(75) Inventors: Sang Oh Lim, Incheon-si (KR); Byoung Kwan Jeong, Jeonju-si (KR); Mi Sun Yoon, Gunsan-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/163,910

(22) Filed: Jun. 27, 2008

(30) Foreign Application Priority Data

May 13, 2008  (KR) .................... 10-2008-0044124

(51) Int. Cl.
*H03K 21/00* (2006.01)
*H03K 23/00* (2006.01)
(52) U.S. Cl. ................ 377/47; 377/48; 377/118
(58) Field of Classification Search ........... None
See application file for complete search history.

(56) References Cited

U.S. PATENT DOCUMENTS

| RE39,578 | E | 4/2007 | Lu |
| 2002/0194558 | A1* | 12/2002 | Wang et al. ............ 714/718 |
| 2003/0154434 | A1* | 8/2003 | Hou ........................ 714/734 |
| 2006/0044990 | A1* | 3/2006 | Kawabe et al. ....... 369/124.14 |
| 2007/0075732 | A1* | 4/2007 | Fruhauf et al. ............ 326/38 |
| 2007/0198101 | A1* | 8/2007 | Leung et al. .............. 700/32 |
| 2008/0303544 | A1* | 12/2008 | Kawamura .............. 326/16 |
| 2008/0316850 | A1* | 12/2008 | Penzes .................... 365/228 |

* cited by examiner

*Primary Examiner*—Tuan Lam
(74) *Attorney, Agent, or Firm*—Townsend and Townsend and Crew LLP

(57) ABSTRACT

The present invention relates to a unit counter block. According to an aspect of the present invention, the unit counter block includes a D-flipflop, a second MUX, and a first MUX. The-flipflop outputs first and second output signals in synchronism with a clock signal. The second MUX selects any one of external data and the second output signal of the D-flipflop in response to a data load signal and outputs a selected signal. The first MUX transfers any one of the first output signal of the D-flipflop and the output signal of the second MUX as an input signal of the D-flipflop in response to a counter enable signal or the data load signal.

22 Claims, 7 Drawing Sheets

100

200

COUNTER OF SEMICONDUCTOR DEVICE

CROSS-REFERENCES TO RELATED APPLICATION

The present application claims priority to Korean patent application number 10-2008-0044124, filed on May 13, 2008, which is incorporated by reference in its entirety.

BACKGROUND OF THE INVENTION

The present invention relates to a counter used in semiconductor devices, and more specifically to a counter which can reduce propagation delay.

Counters used in semiconductor devices can be largely divided into two types. These are a counter employing a half adder structure and a ripple counter employing simple toggling. In the case of the ripple counter, the counter can be designed with a minimum area, but has increased propagation delay due to delays accumulated at every stage and may have an unstable value due to increased data skew.

Meanwhile, the counter employing the half adder structure has an increased area compared with the ripple counter, but has better characteristics in terms of data skew, since data output is synchronized with the clock of a flipflop. However, the counter employing the half adder structure has a carry propagation delay as a carry value can ripple across the half adder structure. This is a significant shortcoming of the counter employing the half adder structure.

To help alleviate this problem, a carry look ahead (CLA) structure was developed. The CLA structure is an adder of a type in which a carry can be quickly calculated if it will be generated or propagated through a 4-bit group. The CLA structure is used to reduce propagation time delay. This structure can reduce carry propagation delay, but has an output terminal whose output returns back to an input terminal. Accordingly, the CLA structure has disadvantage in rising/falling times of the output terminal.

BRIEF SUMMARY OF THE INVENTION

The present invention relates to a counter, which can reduce propagation time delay of the counter and minimize data skew.

A unit counter block according to an aspect of the present invention includes a D-flipflop that outputs first and second output signals in synchronism with a clock signal, a second MUX for selecting any one of external data and the second output signal of the D-flipflop in response to a data load signal and outputting a selected signal, and a first MUX for transferring any one of the first output signal of the D-flipflop and the output signal of the second MUX as an input signal of the D-flipflop in response to a counter enable signal or the data load signal.

A 2-bit counter according to another aspect of the present invention includes a first unit counter block and a second unit counter block. The first unit counter block includes a D-flipflop, a second MUX for selecting any one of external data and a second output signal of the D-flipflop in response to a data load signal and outputting a selected signal, and a first MUX for transferring any one of a first output signal of the D-flipflop and the output signal of the second MUX as an input signal of the D-flipflop in response to a counter enable signal or the data load signal. The second unit counter block includes a D-flipflop, a second MUX for selecting any one of external data and a second output signal of the D-flipflop in response to a data load signal and outputting a selected signal, and a first MUX for transferring any one of a first output signal of the D-flipflop and the output signal of the second MUX as an input signal of the D-flipflop in response to the output signal of the second MUX of the first counter block and a counter enable signal or the data load signal.

An n-bit counter including n counter blocks according to further another aspect of the present invention includes a D-flipflop, a second MUX for selecting any one of external data and a second output signal of the D-flipflop in response to a data load signal and outputting a selected signal, and a first MUX for transferring any one of a first output signal of the D-flipflop and the output signal of the second MUX as an input signal of the D-flipflop in response to a counter enable signal or the data load signal. Here, an $m^{th}$ counter block outputs an $m^{th}$ bit signal, which is toggled in a period where all output signals of second MUXs included in first to $(m-1)^{th}$ counter blocks are at a first level and the counter enable signal is at a second level.

DESCRIPTION OF SPECIFIC EMBODIMENTS

Specific embodiments according to the present invention will be described with reference to the accompanying drawings. However, the present invention is not limited to the disclosed embodiments, but may be implemented in various ways. The embodiments are provided to complete the disclosure of the present invention and to allow those having ordinary skill in the art to understand the scope of the present invention. The present invention is defined by the category of the claims.

Figure 1:
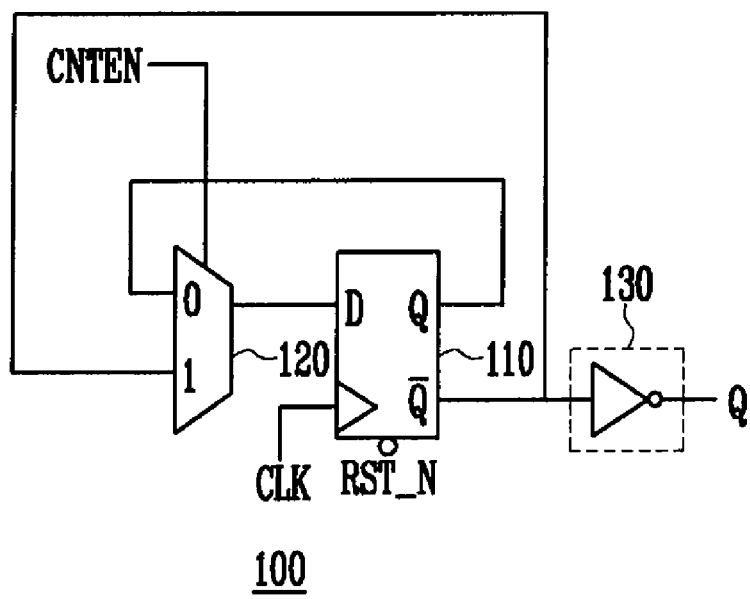
FIG. 1 is a circuit diagram showing a unit counter block of a counter circuit in accordance with an embodiment of the present invention.

FIG. 1 is a circuit diagram showing a unit counter block of a counter circuit in accordance with an embodiment of the present invention. A unit counter block includes a D-flipflop 110, a selector (or multiplexor (MUX)) 120, and an output unit 130. The D-flipflop 110 holds an input signal D during one clock cycle according to a clock signal CLK and outputs a delayed signal. The MUX 120 selects and transfers a first output signal Q or a second output signal /Q of the D-flipflop to the input signal D of the D-flipflop 110 in response to a counter enable signal CNTEN. The output unit 130 inverts and outputs an inverse of the second output signal /Q.

The D-flipflop 110 holds and outputs the input signal D as the first output signal Q and accepts an input signal every rising or falling edge of a clock. That is, if the D-flipflop 110 operates on the basis of a rising edge, when the input signal D of a high level is input at a first rising edge, the D-flipflop 110 continuously outputs a high level (i.e., the input signal D applied at the first rising edge) as the first output signal Q until a second rising edge is applied. If the D-flipflop 110 operates on the basis of a falling edge, when the input signal D of a high level is applied at a first falling edge, the D-flipflop 110 continuously outputs a high level (i.e., the input signal D applied at the first falling edge) as the first output signal Q until a second falling edge is applied. In some implementation, both the falling and raising edges can be used to control the outputs of the D-flipflop.

When the counter enable signal CNTEN is at a low level, the MUX 120 applies the first output signal Q as the input signal D so that a hold function is performed. The first output signal Q is a signal having the same level as that of the input signal D. Thus, although the clock signal CLK has changed, the first output signal (Q) value of the D-flipflop maintains the same level.

When the counter enable signal CNTEN is a high level, the MUX 120 applies the second output signal /Q as the input signal D so that a toggling function is performed (i.e., the held signal is changed). The second output signal /Q is an inverse signal of the input signal D. Thus, when the clock signal CLK is at the rising (or falling edge), the second output signal (/Q) value of the D-flipflop is changed. Further, since the second output signal (/Q) value is inverted by the output unit 130, the first output signal Q is output as a last output. Here, the last output has a waveform with a cycle that is twice the cycle of the clock signal CLK.

As described above, when the counter enable signal CNTEN of a high level is applied, the unit counter block outputs a signal that is toggled once during the cycle of the clock signal CLK. This generates a signal with a period that is twice the size of the clock signal CLK period. When the counter enable signal CNTEN of a low level is applied, the unit counter block holds and outputs a held signal.

Figure 2:
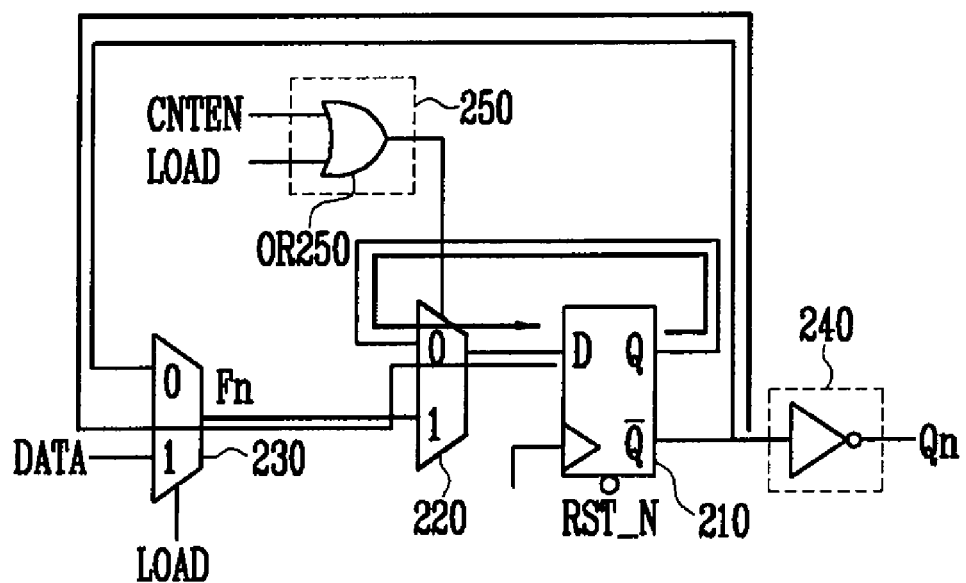
FIG. 2 is a circuit diagram showing a unit counter block having a random input function in accordance with an embodiment of the present invention.

FIG. 2 is a circuit diagram showing a unit counter block having a random input function in accordance with an embodiment of the present invention.

A unit counter block 200 includes a D-flipflop 210, a first MUX 230, a second MUX 230, and an output unit 240. The D-flipflop 210 holds an input signal D during one clock cycle according to a clock signal CLK and outputs the held signal. The second MUX 230 selects and outputs one from a second output signal /Q of the D-flipflop 210 and external data DATA in response to a data load signal LOAD. The first MUX 220 selects and transfers one from a first output signal Q of the D-flipflop and an output signal of the second MUX 230 to the input signal D of the D-flipflop 210 in response to a counter enable signal CNTEN. The output unit 240 inverts and outputs an inverse of the second output signal /Q (or an output signal of the counter block 200). The unit counter block 200 further includes a MUX control unit 250 that decides an operation of the first MUX 220 according to the counter enable signal CNTEN or the data load signal LOAD. The D-flipflop 210 has the same construction as that of the D-flipflop 110 of FIG. 1 and detailed description thereof is omitted.

When the data load signal LOAD of a high level is applied, the second MUX 230 transfers the external data DATA to the first MUX 220 and then to the D-flipflop 210. This performs a random input function. When the data load signal LOAD of a low level is applied, the second MUX 230 transfers the second output signal /Q of the D-flipflop 210 to the first MUX 220 so that the unit counter performs the same function as that of the unit counter block 100 of FIG. 1. Meanwhile, an output signal Fn of the second MUX 230 is used as a carry, which will be input to a next higher counter block. Typically, the output signal of the output unit 240 is used as a carry. In the present embodiment, a signal within the counter block is used as a carry.

The MUX control unit 250 includes an OR gate 250 that uses the counter enable signal CNTEN and the data load signal LOAD as inputs. Thus, when the counter enable signal CNTEN of a high level or the data load signal LOAD of a high level is input, the first MUX performs a toggling function or a random input function.

The first MUX 220 performs a hold function or a toggling function according to the counter enable signal CNTEN. In other words, when the MUX control unit 250 outputs a low level signal, the first MUX 220 performs the hold function. When the MUX control unit 250 outputs a high level signal, the first MUX 220 performs the toggling function. Meanwhile, when the data load signal LOAD is at a high level, the external data DATA is input through the second MUX 230, so that the first MUX 220 performs a random input function.

As described above, an overall operation of the counter block is similar to that of the counter block 100 shown in FIG. 1. One difference is that the external data DATA can be input randomly according to the data load signal LOAD.

Figure 3:
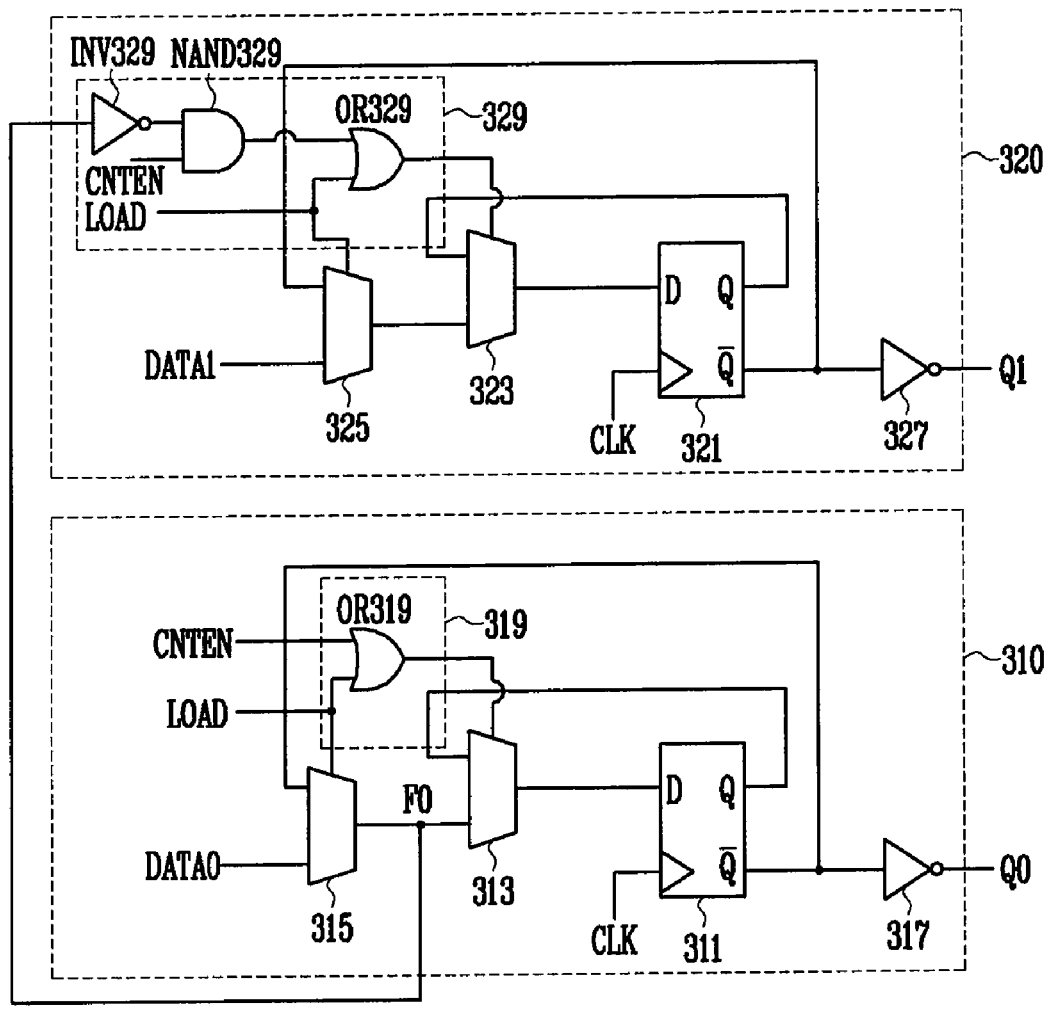
FIG. 3 is a circuit diagram showing a 2-bit counter in accordance with an embodiment of the present invention.

FIG. 3 is a circuit diagram showing a 2-bit counter in accordance with an embodiment of the present invention.

A 2-bit counter 300 includes a first counter block 310 and a second counter block 320. The first counter block 310 has substantially the same construction as that of the unit counter block 200 shown in FIG. 2. That is, the first counter block 310 includes a D-flipflop 311, a first MUX 313, a second MUX 315, and an output unit 317. The D-flipflop 311 holds an input signal D for one clock cycle according to a clock signal CLK and outputs the held signal. The second MUX 315 selects and outputs one from a second output signal /Q of the D-flipflop 311 and external data DATA0 in response to a data load signal LOAD. The first MUX 313 selects and transfers one from a first output signal Q of the D-flipflop and an output signal of the second MUX 315 to the input signal D of the D-flipflop 311 in response to a counter enable signal CNTEN. The output unit 317 inverts and outputs an inverse of the second output signal /Q. The first counter block 310 further includes a first MUX control unit 319 that determines an operation of the first MUX 313 according to the counter enable signal CNTEN or the data load signal LOAD.

The second counter block 320 includes a D-flipflop 321, a first MUX 323, a second MUX 325, and an output unit 327. These circuits operate in a similar manner to those described above in the first counter block 310. The second counter block 320 further includes a second MUX control unit 329 that decides an operation of the first MUX 323 according to a second MUX output signal F0 of the first counter block 310 and the counter enable signal CNTEN or the data load signal LOAD. The reason why the second MUX output signal F0 of the first counter block 310 is used in the second counter block 320 is described below.

Figure 4:
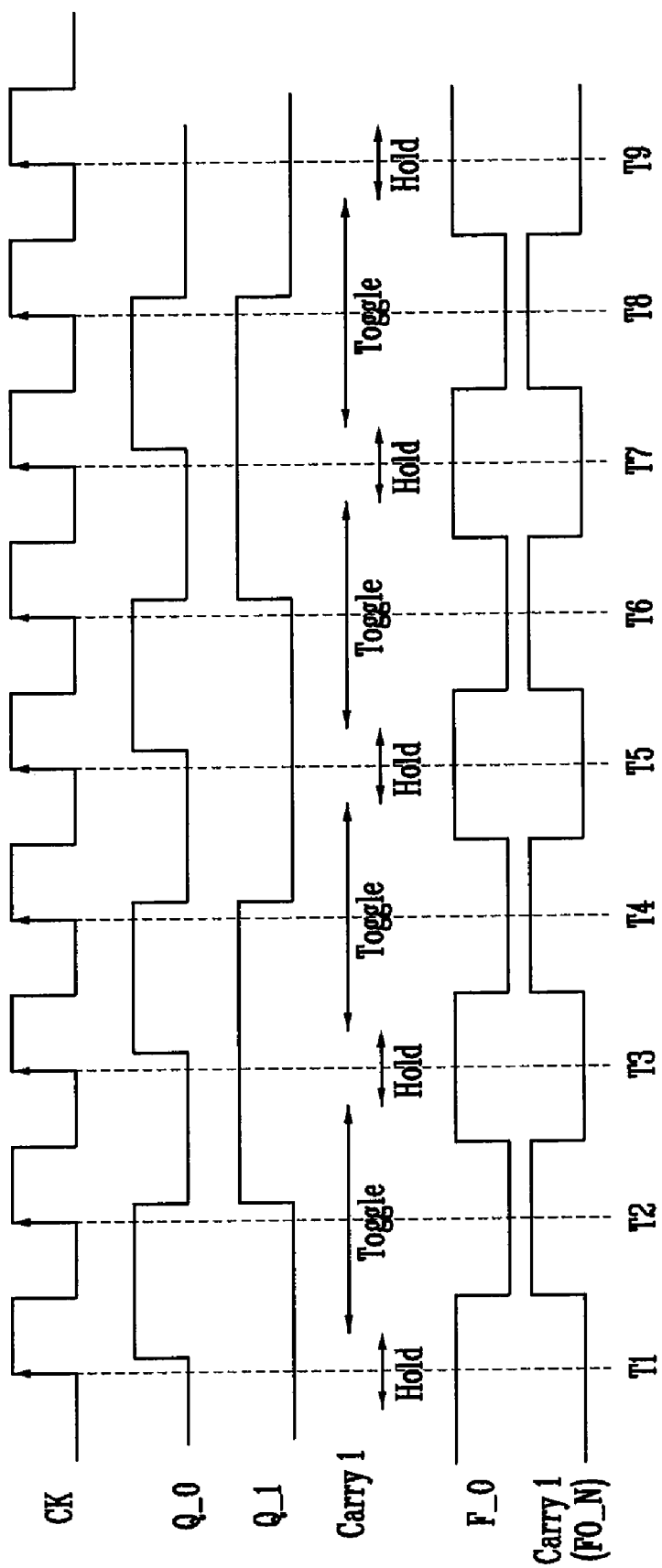
FIG. 4 is a timing diagram showing various waveforms applied when the 2-bit counter in accordance with an embodiment of the present invention is operated.

FIG. 4 is a timing diagram showing various waveforms associated with the 2-bit counter in accordance with an embodiment of the present invention. When the counter enable signal CNTEN of a high level is input, the first counter block 310 performs a toggling function. A waveform of the toggling function corresponds to twice the cycle of a clock signal according to characteristics of the D-flipflop and has its level changed at the rising or falling edge of the clock signal. In FIG. 4, it is shown that the output levels of the waveforms are changed on the basis of the rising edge. An output signal of the first counter block, that is, a first bit signal Q0 has a waveform whose output level is changed at the rising edge of the clock signal CLK. Meanwhile, it should be understood that the waveforms are shown by reflecting delay, occurring in the circuit, to some extent.

In order for a 2-bit counter signal to be output, a second bit signal Q1, as shown in FIG. 4, has to be generated. In other words, a combination of the first bit signal and the second bit signal has to be sequentially increased like 00→01→10→11. The second bit signal Q1 for producing this combination is shown and the second counter block 320 has to output this type of second bit signal Q1.

In order for the second bit signal Q1 to be output, the hold function or the toggling function should be performed selectively at the rising edge of the clock. In other words, at first rising time points T1, T3, T5, T7, and T9 of the clock, the hold function should be performed, and at second rising time points T2, T4, T6, and T8 of the clock, the toggling function should be performed. Consequently, the second MUX control unit 329 has to perform these operations. The existing counter enable signal CNTEN and the existing data load signal LOAD do not satisfy these characteristics. Thus, the output signal F0 of the second MUX 315 included in the first counter block 310 is used as a carry signal in order to perform this control.

When the data load signal LOAD is at a low level, the output signal F0 of the second MUX 315 included in the first counter block 310 has almost the same level as that of the second output signal /Q of the D-flipflop 311 and, therefore, has the waveform shown in FIG. 4. Since values of output signal F0 at the first rising time points and the second rising time points of the clock differ, the second counter block 320 can be controlled to be held at the first rising time points of the clock, but toggled only at the second rising time points of the clock.

Accordingly, the second MUX control unit 329 of the second counter block 320 includes an inverter INV329, a NAND gate NAND329, and a NOR gate NOR329. The inverter INV329 inverts the output signal F0 of the second MUX 315 of the first counter block 310. The NAND gate NAND329 performs a NAND operation on an output signal of the inverter INV329 and the counter enable signal CNTEN. The NOR gate NOR329 performs a NOR operation on an output of the NAND gate NAND 329 and the data load signal LOAD and outputs the operation result to the first MUX 323.

That is, if the counter enable signal CNTEN is at a high level and the clock signal CLK is at the second rising time point T2, the output signal of the second MUX 315 of the first counter block 310 is at a low level (i.e., /Q is low). This means that the second counter block 320 performs the toggling function and outputs the second bit signal Q1 whose output level is changed at the rising time point of the corresponding clock.

Further, if the counter enable signal CNTEN is at a high level and the clock signal CLK is at the third rising time point T3, the output signal of the second MUX 315 of the first counter block 310 is at a high level (i.e., /Q is high). This means that the second counter block 320 performs the hold function and outputs the second bit signal Q1 whose output level is kept unchanged.

Accordingly, when the output signal of the second MUX 315 included in the first counter block 310 is used as a carry signal as shown in FIG. 4, the second bit signal Q1 is output, which has a waveform that is twice the cycle of the first bit signal Q0. Further, since the signal of a specific node is used as a carry without directly using the output signal of the first counter block as a carry, carry propagation delay time can be minimized.

Figure 5:
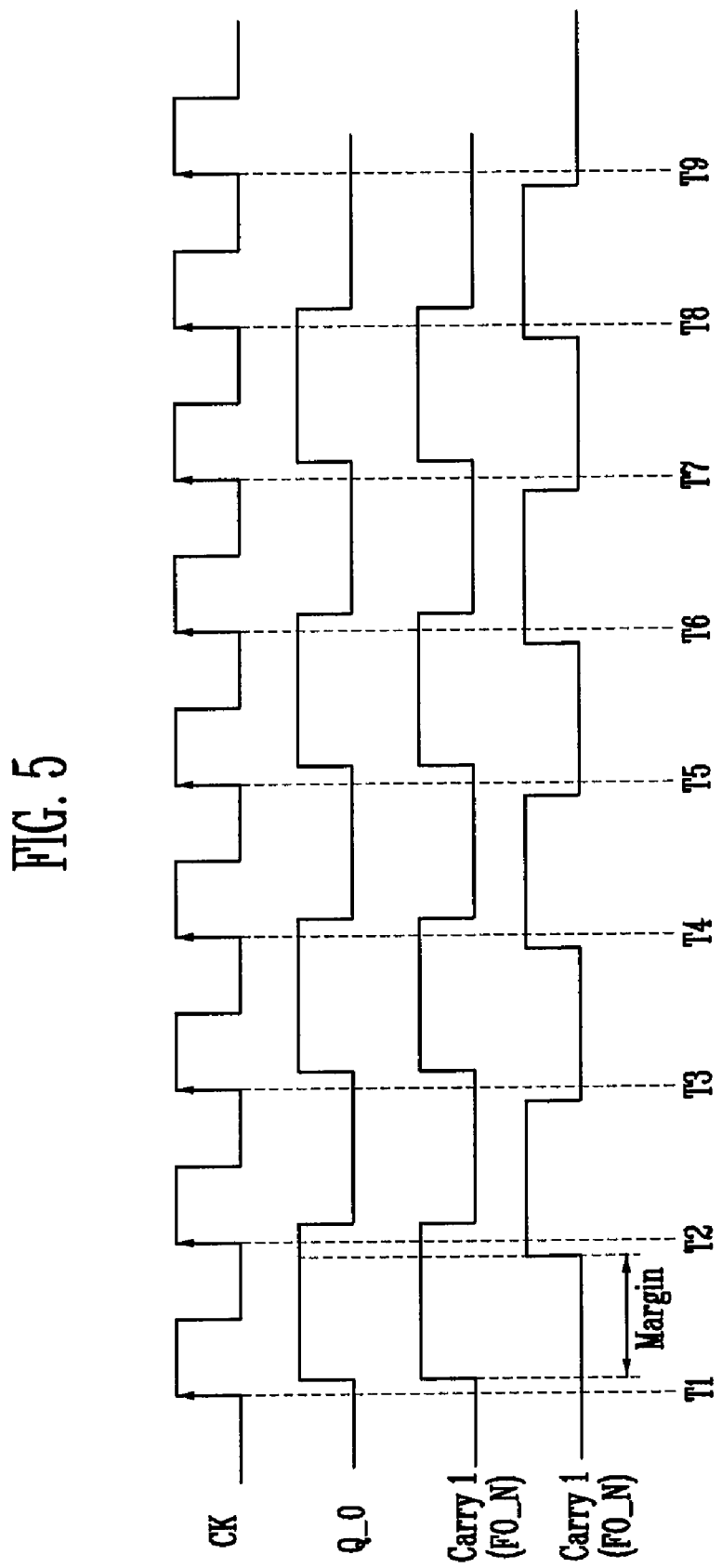
FIG. 5 is a timing diagram showing acceptable operating margin of a carry waveform when the 2-bit counter in accordance with an embodiment of the present invention is operated.

FIG. 5 is a timing diagram showing margin of a carry waveform when the 2-bit counter in accordance with an embodiment of the present invention is operated. A carry signal (F0_N, an inverted signal of the output signal of the second MUX included in the first counter block) only has to have a high level value from the first rising time points T1, T3, T5, T7, and T9 of the clock to the second rising time points T2, T4, T6, and T8 of the clock so that the second counter block performs the toggling function. The carry signal only has to have a high level value at least before reaching the second rising time point. The carry signal has a margin as shown in FIG. 5.

Figure 6:
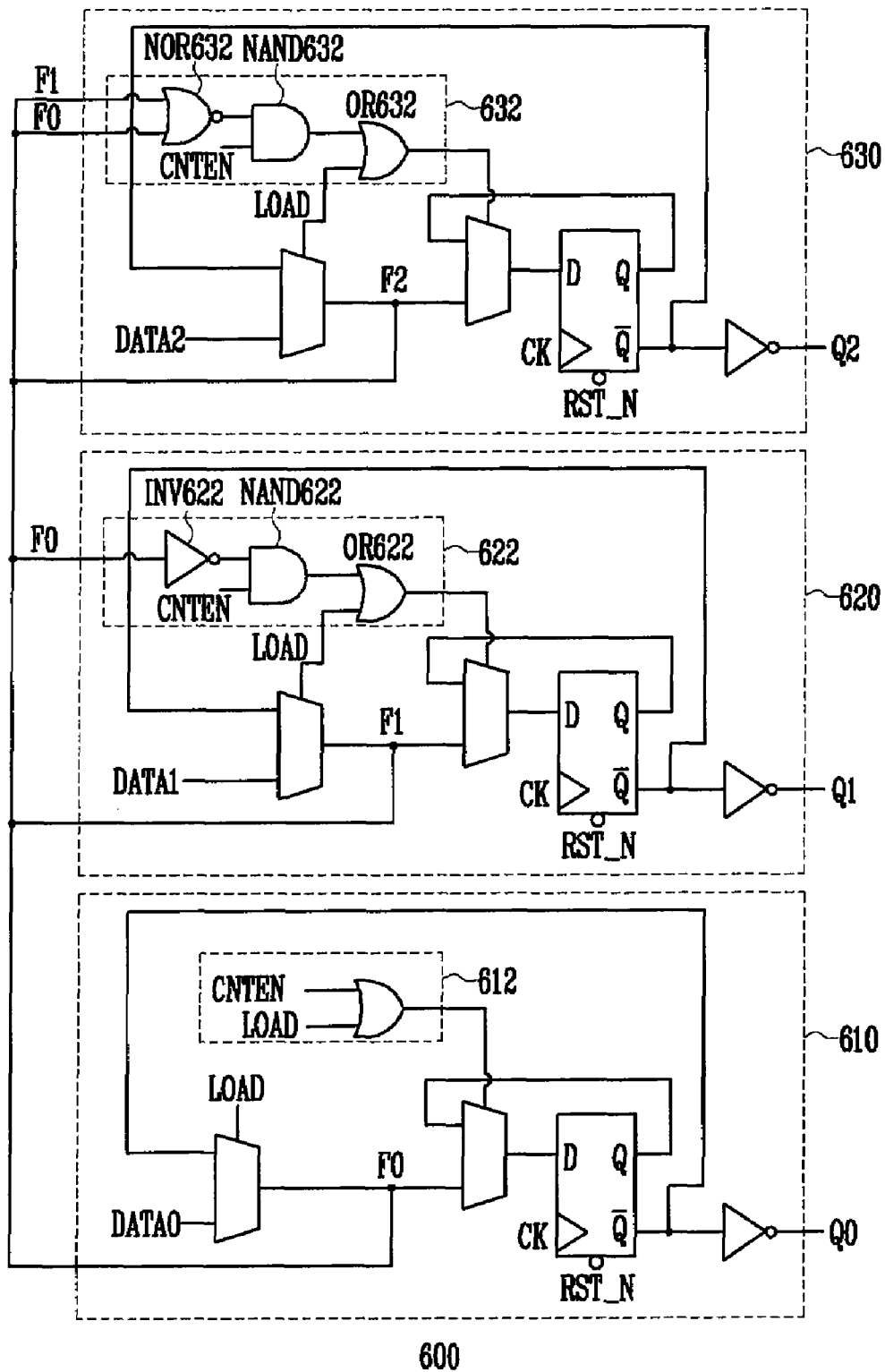
FIG. 6 is a circuit diagram showing a 3-bit counter in accordance with an embodiment of the present invention.

FIG. 6 is a circuit diagram showing a 3-bit counter in accordance with an embodiment of the present invention. A 3-bit counter 600 includes first to third counter blocks 610, 620, and 630. Each of the counter blocks has substantially the same construction as that of the above-described unit counter block. One difference is that a MUX control unit of each counter block has a different construction.

The first counter block 610 outputs a first bit signal Q0 having a cycle, which is twice the cycle of a clock signal.

The second counter block 620 outputs a second bit signal Q1 having a cycle that is twice the cycle of the first bit signal Q0. To this end, an inverted signal of an output signal F0 of a second MUX included in the first counter block is used as a carry. Accordingly, a second MUX control unit 622 includes an inverter INV622 for inverting the output signal F0 of the second MUX of the first counter block, a NAND gate NAND622 that performs a NAND operation on an output of the inverter INV622 and a counter enable signal CNTEN, and an OR gate OR622 that performs an OR operation on an output of the NAND gate NAND622 and a data load signal LOAD and transfers an operation result to a first MUX.

The third counter block 630 outputs a third signal Q2 having a cycle, which is twice the cycle of the second bit signal Q1. To this end, a logically NORed signal of the output signal F0 of the second MUX, included in the first counter block, and an output signal F1 of the second MUX, included in the second counter block, is used as a carry. Accordingly, a second MUX control unit 632 includes a NOR gate NOR632, a NAND gate NAND632, and an OR gate OR632. The NOR gate NOR632 performs a NOR operation on the output signal F0 of the second MUX, included in the first counter block, and the output signal F1 of the second MUX, included in the second counter block. The NAND gate NAND632 performs a NAND operation on an output of the NOR gate NOR632 and a counter enable signal CNTEN. The OR gate OR632 performs an OR operation on an output of the NAND gate NAND632 and a data load signal LOAD and transfers an operation result to a first MUX.

Figure 7:
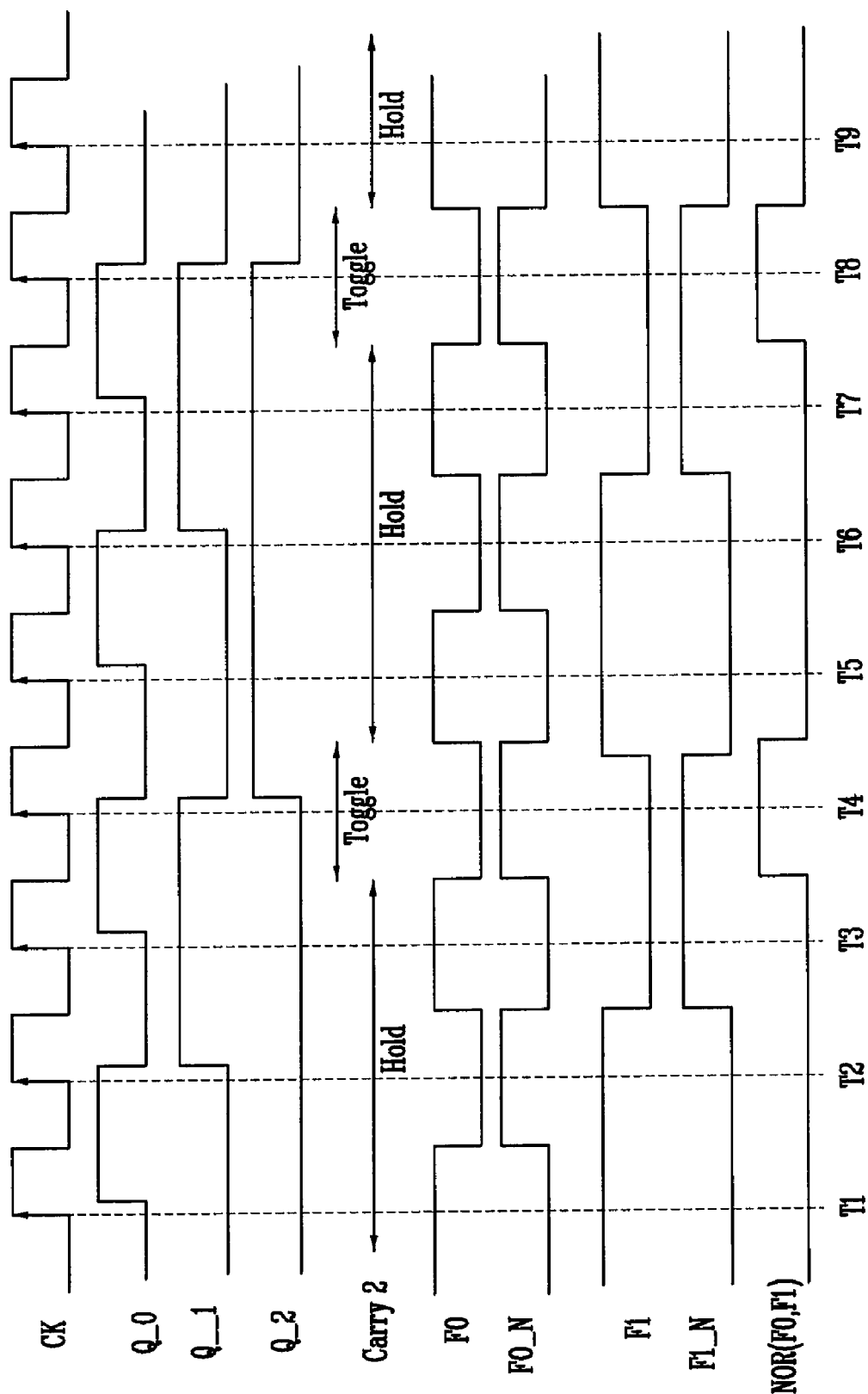
FIG. 7 is a timing diagram showing various waveforms applied when the 3-bit counter in accordance with an embodiment of the present invention is operated.

FIG. 7 is a timing diagram showing various waveforms applied when the 3-bit counter in accordance with an embodiment of the present invention is operated. A first bit signal and a second bit signal, and a signal F0_N used as a carry have the waveforms as shown in FIG. 4. The third bit signal Q2 has to have a cycle, which is twice the cycle of the second bit signal Q1. A necessary carry signal CARRY1 depends on the third bit signal Q2. A logically NORed signal of the output signal F0 of the second MUX, included in the first counter block, and the output signal F1 of the second MUX, included in the second counter block, operates as the corresponding carry signal CARRY1.

The following regularity can be found by designing the 2-bit counter and the 3-bit counter as described above. A n-bit counter includes n unit counter blocks, wherein a carry signal CARRYn−1 applied to an $n^{th}$ counter block is a logically NORed signal of F0 to Fn−1, where F0 is the output signal F0 of the second MUX, included in the first counter block and Fn−1 is the output signal Fn−1 of a second MUX, included in a $(n-1)^{th}$ counter block. That is, when the output signal F0 to the output signal Fn−1 are all logic low, an $n^{th}$ counter block performs the toggling function, so that the level of an $n^{th}$ bit signal is changed.

Figure 8:
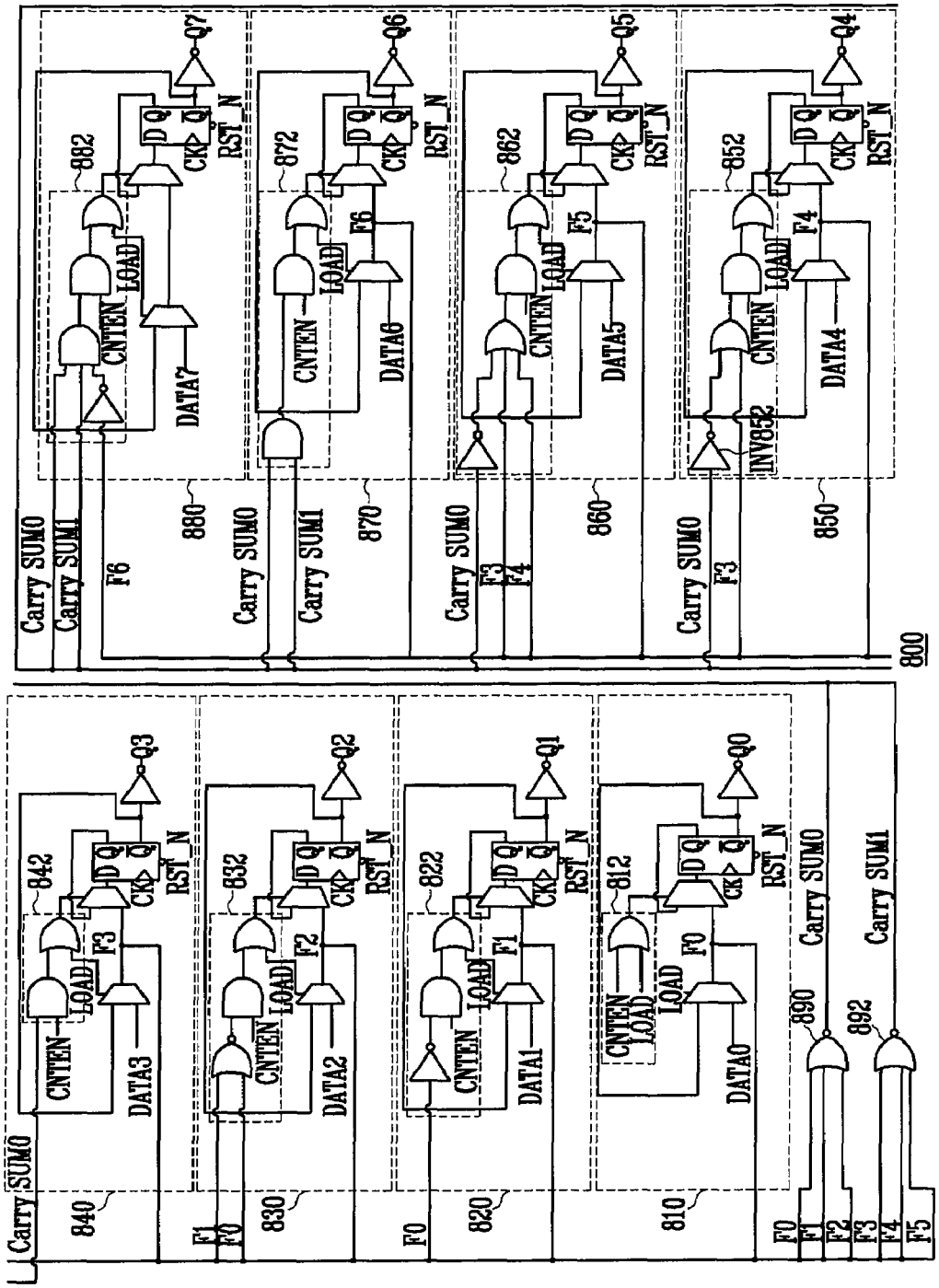
FIG. 8 is a circuit diagram showing an 8-bit counter in accordance with an embodiment of the present invention.

FIG. 8 is a circuit diagram showing an 8-bit counter in accordance with an embodiment of the present invention. An 8-bit counter 800 includes first to eight counter blocks 810 to 880. Each of the counter blocks has almost the same construction as that of the above-described unit counter block, but a MUX control unit of each counter block has a different construction.

The first counter block 810 outputs a first bit signal Q0 having a cycle, which is twice the cycle of a clock signal.

The second counter block 820 outputs a second bit signal Q1 having a cycle, which is twice the cycle of the first bit signal Q0. To this end, an inverted signal of an output signal F0 of a second MUX included in the first counter block is used as a carry. Accordingly, a second MUX control unit 822 includes an inverter for inverting the output signal F0 of the second MUX of the first counter block, a NAND gate for performing a NAND operation on an output of the inverter and a counter enable signal CNTEN, and an OR gate for performing an OR operation on an output of the NAND gate and a data load signal LOAD and transferring an operation result to a first MUX.

The third counter block 830 outputs a third signal Q2 having a cycle, which is twice the cycle of the second bit signal Q1. To this end, a logically NORed signal of the output signal F0 of the second MUX, included in the first counter block, and an output signal F1 of the second MUX, included in the second counter block, is used as a carry. Accordingly, a third MUX control unit 832 includes a NOR gate for performing a NOR operation on the output signal F0 of the second MUX, included in the first counter block, and the output signal F1 of the second MUX, included in the second counter block, a NAND gate for performing a NAND operation on an output of the NOR gate and a counter enable signal CNTEN, and an OR gate for performing an OR operation on an output of the NAND gate and a data load signal LOAD and transferring an operation result to a first MUX.

The fourth counter block 840 outputs a fourth signal Q3 having a cycle, which is twice the cycle of the third bit signal Q2. To this end, a logically NORed signal of the output signal F0 of the second MUX, included in the first counter block, an output signal F1 of a second MUX, included in the second counter block, and an output signal F2 of a second MUX, included in the third counter block is used as a carry. Accordingly, a fourth MUX control unit 842 includes a NOR gate for performing a NOR operation on the output signals F0, F1, and F2 of the second MUXs respectively included in the first to third counter blocks; a NAND gate for performing a NAND operation on an output of the NOR gate and a counter enable signal CNTEN; and an OR gate for performing an OR operation on an output of the NAND gate and a data load signal LOAD. The operation result of the fourth MUX control unit 842 is transferred to a first MUX.

Alternatively, in the 8-bit counter 800 according to an alternative embodiment, a NOR gate 890 for performing a NOR operation on the output signals F0, F1, and F2 of the second MUXs of the first to third counter blocks may be disposed outside the fourth MUX control unit 842 so that the NOR gate 890 can be used commonly. This configuration can be reused in subsequent counter blocks.

The fifth counter block 850 outputs a fifth signal Q4 having a cycle, which is twice the cycle of the fourth bit signal Q3. To this end, a logically NORed signal of the output signals F0, F1, F2, and F3 of the second MUXs respectively included in the first to fourth counter blocks is used as a carry. Accordingly, a fifth MUX control unit 852 includes a NOR gate for performing a NOR operation on the output signals F0, F1, F2, and F3 of the second MUXs respectively included in the first to fourth counter blocks; a NAND gate for performing a NAND operation on an output of the NOR gate and a counter enable signal CNTEN; and an OR gate for performing an OR operation on an output of the NAND gate and a data load signal LOAD. The operation result of the fifth MUX control unit 852 is transferred to a first MUX.

As another embodiment, the fifth MUX control unit 852 may include an inverter for inverting an output of a NOR gate 890 for performing a NOR operation on the output signals F0, F1, and F2 of the second MUXs respectively included in the first to third counter blocks, a NOR gate for performing a NOR operation on an output of the inverter and the output signal F3 of the second MUX of the fourth counter block; a NAND gate for performing a NAND operation on an output of the NOR gate and a counter enable signal CNTEN; and an OR gate for performing an OR operation on an output of the NAND gate and a data load signal LOAD. The operation result of the fifth MUX control unit 852 is transferred to a first MUX.

The sixth counter block 860 outputs a sixth signal Q5 having a cycle, which is twice the cycle of the fifth bit signal Q4. To this end, a logically NORed signal of the output signals F0, F1, F2, F3, and F4 of the second MUXs respectively included in the first to fifth counter blocks is used as a carry. Accordingly, a sixth MUX control unit 862 includes a NOR gate for performing a NOR operation on the output signals F0, F1, F2, F3, and F4 of the second MUXs respectively included in the first to fifth counter blocks; a NAND gate for performing a NAND operation on an output of the NOR gate and a counter enable signal CNTEN; and an OR gate for performing an OR operation on an output of the NAND gate and a data load signal LOAD. The operation result of the sixth MUX control unit 862 is transferred to a first MUX.

As another embodiment, the sixth MUX control unit 862 may include an inverter for inverting an output of a NOR gate 890 for performing a NOR operation on the output signals F0, F1, and F2 of the second MUXs respectively included in the first to third counter blocks; a NOR gate for performing a NOR operation on an output of the inverter and the output signals F3 and F4 of the second MUXs of the fourth and fifth counter blocks; a NAND gate for performing a NAND operation on an output of the NOR gate and a counter enable signal CNTEN; and an OR gate for performing an OR operation on an output of the NAND gate and a data load signal LOAD. The operation result of the sixth MUX control unit 862 is transferred to a first MUX.

The seventh counter block 870 outputs a seventh signal Q6 having a cycle, which is twice the cycle of the sixth bit signal Q5. To this end, a logically NORed signal of the output signals F0, F1, F2, F3, F4, and F5 of the second MUXs respectively included in the first to sixth counter blocks is used as a carry. Accordingly, a seventh MUX control unit 872 includes a NOR gate for performing a NOR operation on the output signals F0, F1, F2, F3, F4, and F5 of the second MUXs respectively included in the first to sixth counter blocks; a NAND gate for performing a NAND operation on an output of the NOR gate and a counter enable signal CNTEN; and an OR gate for performing an OR operation on an output of the NAND gate and a data load signal LOAD. The operation result of the seventh MUX control unit 872 is transferred to a first MUX.

Alternatively, in the 8-bit counter 800 according to an alternative embodiment, a NOR gate 892 for performing a NOR operation on the output signals F3, F4, and F5 of the second MUXs respectively included in the fourth to sixth counter blocks may be disposed outside the seventh MUX control unit 872 so that the NOR gate 892 can be used commonly. This configuration can be reused in subsequent counter blocks.

If this embodiment is employed, the seventh MUX control unit 872 includes a first NAND gate, a second NAND gate, and an OR gate. The first NAND gate performs a NAND operation on an output of the NOR gate 890 for logically NORing the output signals F0, F1, and F2 of the second MUXs, respectively included in the first to third counter blocks, and an output of the NOR gate 892 for logically NORing the output signals F3, F4, and F5 of the second MUXs, respectively included in the fourth to sixth counter blocks. The second NAND gate performs a NAND operation on an output of the first NAND gate and the counter enable signal CNTEN. The OR gate performs an OR operation on an output of the second NAND gate and the data load signal LOAD and transferring an operation result to the first MUX.

The eighth counter block 880 outputs an eighth signal Q7 having a cycle, which is twice the cycle of the seventh bit signal Q6. To this end, a logically NORed signal of the output signals F0, F1, F2, F3, F4, F5, and F6 of the second MUXs respectively included in the first to seventh counter blocks is used as a carry. Accordingly, a eighth MUX control unit 882 includes a NOR gate for performing a NOR operation on the output signals F0, F1, F2, F3, F4, F5, and F6 of the second MUXs respectively included in the first to seventh counter blocks; a NAND gate for performing a NAND operation on an output of the NOR gate and a counter enable signal CNTEN; and an OR gate for performing an OR operation on an output of the NAND gate and a data load signal LOAD. The operation result of the eighth MUX control unit 882 is transferred to a first MUX.

As another embodiment, the eighth MUX control unit 882 may include an inverter for inverting the output signal F6 of the second MUX included in the seventh counter block; a first NAND gate for performing a NAND operation on an output of the inverter, an output of the NOR gate 890, and an output of the NOR gate 892; a second NAND gate for logically NANDing an output of the first NAND gate and the counter enable signal CNTEN; and an OR gate for logically ORing an output of the second NAND gate and the data load signal LOAD. The operation result of the eight MUX control unit 882 is transferred to a first MUX.

According to the above configurations of the present invention, a counter with reduced propagation time delay, improved data skew, and stabilized data outputs can be provided.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A unit counter block, comprising:
   a D-flipflop that outputs first and second output signals according to a clock signal;
   a second selector to select one from external data and the second output signal of the D-flipflop in response to a data load signal and output a selected signal; and
   a first selector to transfer one from the first output signal of the D-flipflop and the output signal of the second selector as an input signal of the D-flipflop in response to a counter enable signal or the data load signal.

2. The unit counter block of claim 1, wherein the D-flipflop outputs an input signal from a point of time at which a first rising edge of the clock signal is input to a point of time at which a second rising edge of the clock signal is input as the first output signal, wherein the first and second selectors are multiplexers.

3. The unit counter block of claim 1, wherein the first selector transfers the output signal of the second selector as the input signal of the D-flipflop when the counter enable signal of a high level is applied, and transfers the first output signal of the D-flipflop as the input signal of the D-flipflop when the counter enable signal of a low level is applied.

4. The unit counter block of claim 1, wherein the second selector transfers the external data to the first selector when a data input signal of a high level is input, and transfers the second output signal of the D-flipflop to the first selector when the data input signal of a low level is input.

5. The unit counter block of claim 1, wherein the first selector transfers the external data, which is transferred from the second selector, as the input signal of the D-flipflop when a data input signal of a high level is input.

6. The unit counter block of claim 1, wherein the unit counter block outputs the first output signal that is toggled at a cycle being twice that of the clock signal when the counter enable signal of a high level is input, and outputs the first output signal that is held at a specific level when the counter enable signal of a low level is input.

7. The unit counter block of claim 1, further comprising an output unit for inverting the second output signal of the D-flipflop and outputting an inverted output.

8. The unit counter block of claim 1, further comprising a selector control unit to control an operation of the first selector using a logically summed signal of the counter enable signal and the data load signal.

9. A 2-bit counter, comprising:
   a first unit counter block, comprising a D-flipflop, a second selector to select one from external data and a second output signal of the D-flipflop in response to a data load signal and output a selected signal, and a first selector to transfer one from a first output signal of the D-flipflop and the output signal of the second selector as an input signal of the D-flipflop in response to a counter enable signal or the data load signal; and
   a second unit counter block, comprising a D-flipflop, a second selector to select one from external data and a second output signal of the D-flipflop in response to a data load signal and output a selected signal, and a first selector to transfer one from a first output signal of the D-flipflop and the output signal of the second selector as an input signal of the D-flipflop in response to the output signal of the second selector of the first counter block and a counter enable signal or the data load signal.

10. The 2-bit counter of claim 9, wherein:
    the first output signal of the D-flipflop included in the first counter block is used as a first bit signal, and the first output signal of the D-flipflop included in the second counter block is used as a second bit signal.

11. The 2-bit counter of claim 9, wherein each of the first and second counter blocks further comprises an output unit to invert the second output signal of the D-flipflop and output an inverted signal.

12. The 2-bit counter of claim 9, wherein:
the first output signal of the D-flipflop included in the first counter block is a signal that is toggled at a cycle being twice that of a clock signal applied to the D-flipflop, and
the first output signal of the D-flipflop included in the second counter block is a signal that is toggled at a cycle being twice that of the first output signal of the D-flipflop included in the first counter block.

13. The 2-bit counter of claim 9, wherein:
during a period where the output signal of the second selector of the first counter block is held at a low level, the first output signal of the D-flipflop of the second counter block is toggled, and
during a period where the output signal of the second selector of the first counter block is held at a high level, the first output signal of the D-flipflop of the second counter block is held.

14. The 2-bit counter of claim 9, wherein the first selector of the first counter block transfers the output signal of the second selector of the first counter block as the input signal of the D-flipflop of the first counter block when the counter enable signal of a high level is input, and transfers the first output signal of the D-flipflop as the input signal of the D-flipflop of the first counter block when the counter enable signal of a low level is input.

15. The 2-bit counter of claim 9, wherein the first selector of the second counter block transfers the output signal of the second selector of the second counter block as the input signal of the D-flipflop of the second counter block when the output signal of the second selector of the first counter block is at a low level and the counter enable signal of the first counter block is at a high level, and transfers the first output signal of the D-flipflop as the input signal of the D-flipflop when the output signal of the second selector of the first counter block is at a high level or the counter enable signal of the first counter block is at a low level.

16. The 2-bit counter of claim 9, wherein the second selector of each of the first and second counter blocks transfers the external data to the first selector when a data input signal of a high level is input and transfers the second output signal of the D-flipflop to the first selector when the data input signal of a low level is input.

17. The 2-bit counter of claim 9, wherein the first selector of each of the first and second counter blocks transfers the external data that is transferred from the second selector as the input signal of the D-flipflop when a data input signal of a high level is input.

18. The 2-bit counter of claim 9, wherein the second counter block further comprises a selector control unit, comprising an inverter to invert the output signal of the second selector of the first counter block, a AND gate to perform a AND operation on an output signal of the inverter and the counter enable signal, and a OR gate for performing a OR operation on an output signal of the AND gate and the data load signal.

19. An n-bit counter, comprising
n counter blocks respectively comprising a D-flipflop, a second selectors to select one from external data and a second output signal of the D-flipflop in response to a data load signal and output a selected signal, and a first selector to transfer one from a first output signal of the D-flipflop and the output signal of the second selector as an input signal of the D-flipflop in response to a counter enable signal or the data load signal,
wherein an $m^{th}$ counter block outputs an $m^{th}$ bit signal that is toggled in a period where all output signals of the second selectors included in first to $(m-1)^{th}$ counter blocks are at a first level and the counter enable signal is at a second level.

20. The n-bit counter of claim 19, wherein the $m^{th}$ bit signal is a signal that is toggled at a cycle being twice that of a $(m-1)^{th}$ bit signal output from the $(m-1)^{th}$ counter block.

21. The n-bit counter of claim 19, wherein the $m^{th}$ counter block further comprises a selector control unit, comprising a OR gate to perform a OR operation on output signals of second selectors included in the first to $(m-1)^{th}$ counter blocks, a AND gate to perform a NAND operation on an output signal of the NOR gate and the counter enable signal, and a OR gate to perform a NOR operation on an output signal of the AND gate and the data load signal.

22. The n-bit counter of claim 19, wherein the $m^{th}$ counter block outputs the $m^{th}$ bit signal that is held in a period where any one of the output signals of the second selectors included in the first to $(m-1)^{th}$ counter blocks is at the second level or the counter enable signal is at the first level.

* * * * *